(12) United States Patent
Maki

(10) Patent No.: US 10,069,504 B2
(45) Date of Patent: Sep. 4, 2018

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 196 days.

(21) Appl. No.: 14/923,893

(22) Filed: Oct. 27, 2015

(65) Prior Publication Data

US 2016/0218727 A1 Jul. 28, 2016

(30) Foreign Application Priority Data

Oct. 31, 2014 (JP) ................. 2014-223560

(51) Int. Cl.
| | |
|---|---|
| H01S 1/06 | (2006.01) |
| H03L 7/26 | (2006.01) |
| H03L 1/02 | (2006.01) |
| H01S 3/04 | (2006.01) |
| G04F 5/14 | (2006.01) |

(52) U.S. Cl.
CPC ............... H03L 7/26 (2013.01); G04F 5/14 (2013.01); H01S 1/06 (2013.01); H01S 3/04 (2013.01); H03L 1/02 (2013.01)

(58) Field of Classification Search
CPC ..... G04F 5/14; H01S 1/06; H01S 3/04; H03L 7/26; H03L 1/02

USPC ...................................... 331/3, 94.1
See application file for complete search history.

(56) References Cited

U.S. PATENT DOCUMENTS

| | | | |
|---|---|---|---|
| 5,656,974 A | 8/1997 | Thomann et al. | |
| 6,320,472 B1 | 11/2001 | Vanier | |
| 6,801,091 B2 * | 10/2004 | Atsumi | G04F 5/14 |
| | | | 331/3 |
| 6,927,636 B2 * | 8/2005 | Deng | H01S 1/06 |
| | | | 331/3 |
| 7,098,992 B2 | 8/2006 | Ohtsuki et al. | |
| 2017/0179967 A1 * | 6/2017 | Maki | G01S 19/37 |

FOREIGN PATENT DOCUMENTS

| | | |
|---|---|---|
| JP | 09-051270 A | 2/1997 |
| JP | 2001-156388 A | 6/2001 |
| JP | 2013-145818 A | 7/2013 |

* cited by examiner

Primary Examiner — Arnold Kinkead
(74) Attorney, Agent, or Firm — Harness, Dickey & Pierce, P.L.C.

(57) ABSTRACT

An atomic oscillator includes an atomic cell in which alkali metal atoms are encapsulated, a light source section configured to receive the supply of a bias and emit light including a resonance light pair for causing the alkali metal atoms to resonate, a temperature adjusting element configured to adjust the temperature of the light source section, a bias detecting section configured to detect information concerning the bias, and a light-source-temperature control section configured to control the temperature adjusting element using the information detected by the bias detecting section.

17 Claims, 12 Drawing Sheets

QUANTUM INTERFERENCE DEVICE, ATOMIC OSCILLATOR, ELECTRONIC APPARATUS, AND MOVING OBJECT

CROSS REFERENCE

This application claim benefit of Japanese Application No. 2014-223560, filed on Oct. 31, 2014. The disclosure of the prior application is hereby incorporated by reference herein in its entirety.

BACKGROUND

1. Technical Field

The present invention relates to a quantum interference device, an atomic oscillator, an electronic device, and a moving object.

2. Related Art

As an oscillator having a highly accurate oscillation characteristic for a long term, there is known an atomic oscillator that oscillates on the basis of energy transition of atoms of alkali metal such as rubidium or cesium.

In general, the operation principle of an atomic oscillator is roughly divided into a system utilizing a double resonance phenomenon by light and a microwave and a system utilizing a quantum interference effect (Coherent Population Trapping (CPT)) by two kinds of light having different wavelengths. However, in recent years, the atomic oscillator utilizing the quantum interference effect is expected to be mounted on various apparatuses because the atomic oscillator can be further reduced in size than the atomic oscillator utilizing the double resonance phenomenon.

For example, as disclosed in U.S. Pat. No. 6,320,472 (Patent Literature 1), the atomic oscillator utilizing the quantum interference effect includes a cell (an atomic cell) encapsulating gaseous alkali metal, alight source that emits a resonance light pair for causing the alkali metal in the cell to resonate, and a photo detector that detects the resonance light pair transmitted through the gas cell. The atomic oscillator causes an electromagnetically induced transparency (EIT) in which, when a frequency difference between two kinds of resonance light is a specific value, both of the two kinds of resonance light are transmitted without being absorbed by the alkali metal in the gas cell, detects an EIT signal, which is a steep signal generated according to the EIT, with the photo detector, and uses the EIT signal as a reference signal.

As the light source, in general, a surface emitting laser that receives the supply of a bias current and emits light is used. Alight emitting element such as the surface emitting laser has a characteristic that a light emission wavelength changes according to the bias current and has an aging characteristic in which, even if the bias current is fixed, the light emission wavelength changes with time (gradually over a long period). Therefore, the atomic oscillator described in Patent Literature 1 controls the bias current supplied to the light source to fix the light emission wavelength.

However, in the atomic oscillator described in Patent Literature 1, since an emitted light amount changes according to the change in the bias current, frequency stability (in particular, long-term frequency stability) is deteriorated because of the influence of a phenomenon called light shift in which the resonance frequency of the alkali metal changes according to a change in the density of an amount of light irradiated on the alkali metal.

SUMMARY

An advantage of some aspects of the invention is to provide a quantum interference device, an atomic oscillator, an electronic apparatus, and a moving object that can improve frequency stability.

The invention can be implemented as the following forms or application examples.

Application Example 1

A quantum interference device according to this application example includes: an atomic cell in which metal atoms are encapsulated; a light source section configured to receive a bias and emit light including a resonance light pair for causing the metal atoms to resonate; a temperature adjusting section configured to adjust the temperature of the light source section; a bias detecting section configured to detect information concerning the bias; and a light-source-temperature control section configured to control the temperature adjusting section using the information detected by the bias detecting section.

With the quantum interference device, it is possible to adjust the wavelength of the light emitted from the light source section while reducing fluctuation in the intensity of the light. Therefore, it is possible to reduce a phenomenon called light shift in which the resonance frequency of the metal atoms changes according to a change in the intensity (the density) of the light irradiated on the metal atoms in the atomic cell. As a result, it is possible to improve frequency stability (in particular, long-term frequency stability).

Application Example 2

In the quantum interference device according to this application example, it is preferable that the quantum interference device further includes a storing section having stored therein a reference value of the bias, and the light-source-temperature control section controls the temperature adjusting section using a comparison result of the information detected by the bias detecting section and the reference value.

With this configuration, it is possible to efficiently adjust the bias to keep constant the intensity of the light emitted from the light source section.

Application Example 3

In the quantum interference device according to this application example, it is preferable that the light source section includes a surface emitting laser.

In a light emitting element such as the surface emitting laser, a light emission wavelength changes involving a change in an emitted light amount according to a bias current. However, the light emitting element can change the light emission wavelength without involving the change in the emitted light amount according to temperature. Therefore, it is possible to adjust the wavelength of the light emitted from the light source section while reducing fluctuation in the intensity of the light.

Application Example 4

In the quantum interference device according to this application example, it is preferable that the information detected by the bias detecting section includes a voltage value of the bias.

With this configuration, it is possible to efficiently adjust the bias to keep constant the intensity of the light emitted from the light source section.

Application Example 5

In the quantum interference device according to this application example, it is preferable that the information detected by the bias detecting section includes a current value of the bias.

With this configuration, it is possible to efficiently set the bias to keep constant the intensity of the light emitted from the light source section.

Application Example 6

In the quantum interference device according to this application example, it is preferable that the quantum interference device further includes a bias control section configured to control the bias to adjust the wavelength of the light emitted from the light source section to a set value.

With this configuration, it is possible to improve short-term frequency stability.

Application Example 7

In the quantum interference device according to this application example, it is preferable that the light-source-temperature control section has a function of controlling the temperature adjusting section to adjust the light source section to a set temperature and a function of adjusting, at a time interval longer than a control time interval of the bias control section, the set temperature using the information detected by the bias detecting section.

With this configuration, it is possible to improve both of the short-term frequency stability and the long-term frequency stability.

Application Example 8

In the quantum interference device according to this application example, it is preferable that the time interval for adjusting the set temperature is within a range of time equal to or longer than 1000 seconds and equal to or shorter than 1000000 seconds.

With this configuration, it is possible to perform the control by the light-source-temperature control section while reducing an adverse effect on the short-term frequency stability.

Application Example 9

An atomic oscillator according to this application example includes the quantum interference device according to the application example.

With this configuration, it is possible to provide the atomic oscillator having excellent frequency stability.

Application Example 10

An electronic apparatus according to this application example includes the quantum interference device according to the application example.

With this configuration, it is possible to provide the electronic apparatus including the quantum interference device that can improve frequency stability.

Application Example 11

A moving object according to this application example includes the quantum interference device according to the application example.

With this configuration, it is possible to provide the moving object including the quantum interference device that can improve frequency stability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A quantum interference device, an atomic oscillator, an electronic apparatus, and a moving object according to the invention are explained in detail below on the basis of embodiments shown in the accompanying drawings.

1. Atomic Oscillator (Quantum Interference Device)

First, an atomic oscillator according to the invention (an atomic oscillator including a quantum interference device according to the invention) is explained. Note that, in the following explanation, an example is explained in which the quantum interference device according to the invention is applied to the atomic oscillator. However, the quantum interference device according to the invention is not limited to this and is applicable to, for example, a magnetic sensor and a quantum memory besides the atomic oscillator.

First Embodiment

Figure 1:
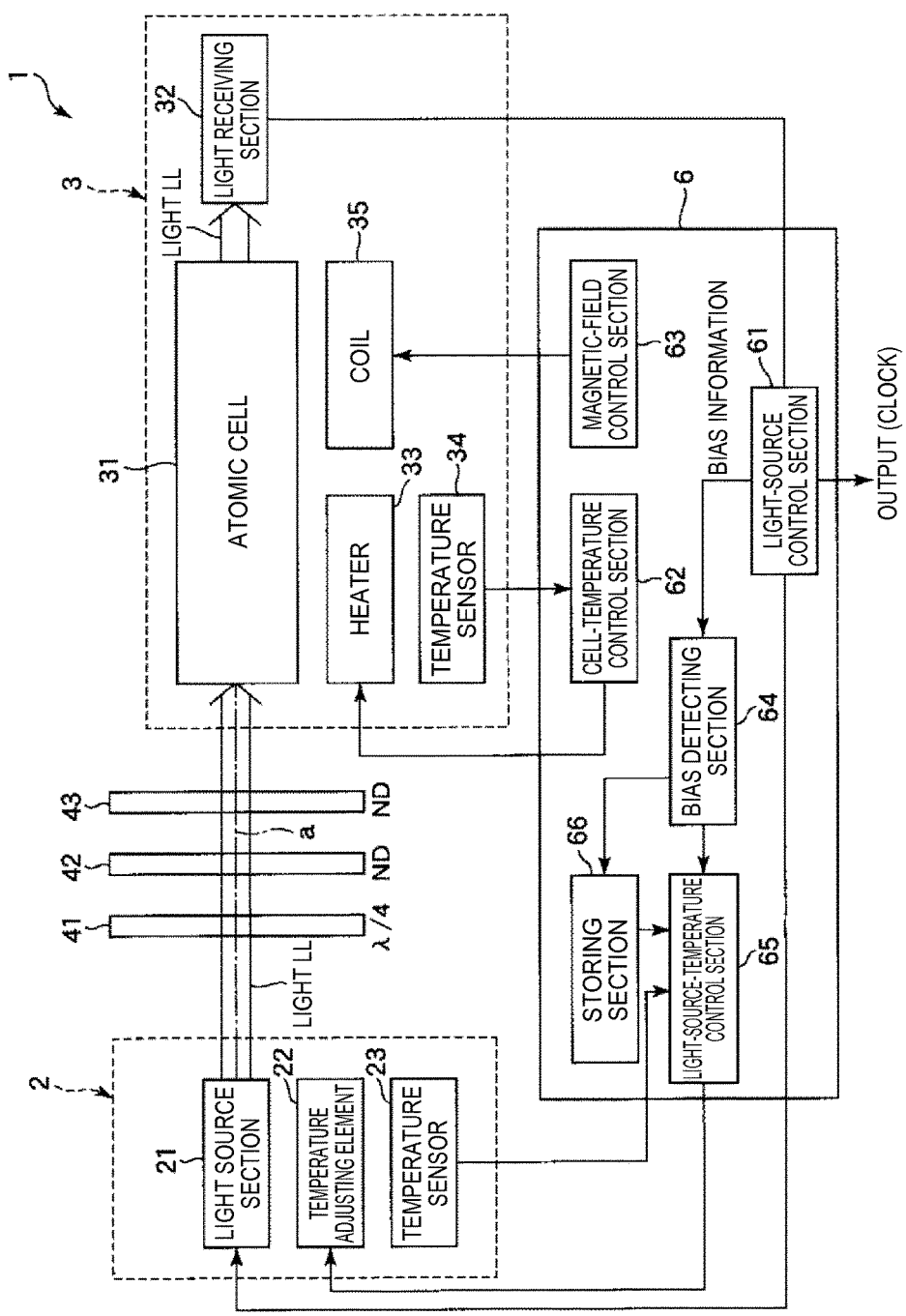
FIG. 1 is a schematic diagram showing the schematic configuration of an atomic oscillator (a quantum interference device) according to a first embodiment of the invention.
Figure 2:
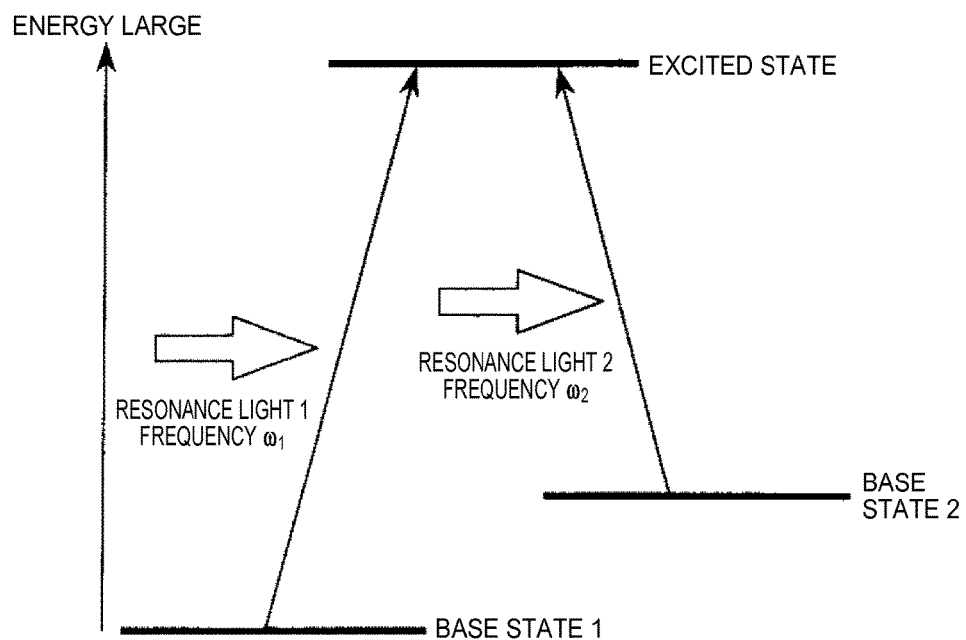
FIG. 2 is a diagram for explaining an energy state of alkali metal.
Figure 3:
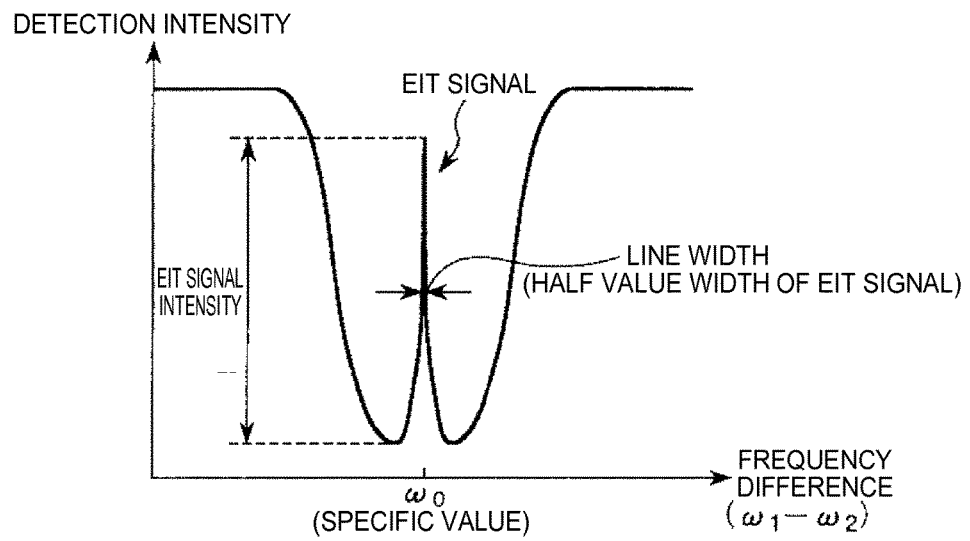
FIG. 3 is a graph showing a relation between a frequency difference between two lights emitted from a light source section and the intensity of light detected by a light receiving section.

FIG. 1 is a schematic diagram showing the schematic configuration of an atomic oscillator (a quantum interference device) according to a first embodiment of the invention. FIG. 2 is a diagram for explaining an energy state of alkali metal. FIG. 3 is a graph showing a frequency difference between two lights emitted from a light source section and the intensity of light detected by a light receiving section.

An atomic oscillator 1 shown in FIG. 1 is an atomic oscillator utilizing a quantum interference effect.

The atomic oscillator 1 includes, as shown in FIG. 1, a light source side unit 2, a cell side unit 3, optical components 41, 42, and 43 provided between the units 2 and 3, and a control section 6 that controls the units 2 and 3.

The light source side unit 2 includes a light source section 21, a temperature adjusting element 22, and a temperature sensor 23. The cell side unit 3 includes an atomic cell 31, a light receiving section 32, a heater 33, a temperature sensor 34, and a coil 35.

First, the principle of the atomic oscillator 1 is briefly explained.

As shown in FIG. 1, in the atomic oscillator 1, the light source section 21 emits light LL to the atomic cell 31. The light receiving section 32 detects the light LL transmitted through the atomic cell 31.

In the atomic cell 31, gaseous alkali metal (metal atoms) is encapsulated. As shown in FIG. 2, the alkali metal has an energy level of a three-level system. The alkali metal can take three states, i.e., two base states (base states 1 and 2) having different energy levels and an excitation state. The base state 1 is an energy state lower than the base state 2.

The light LL emitted from the light source section 21 includes two kinds of resonance lights 1 and 2 (a resonance light pair) having different frequencies. When the two kinds of resonance lights 1 and 2 are irradiated on the gaseous alkali metal explained above, light absorptance (light transmittance) in the alkali metal of the resonance lights 1 and 2 changes according to a difference ($\omega_1$-$\omega_2$) between a frequency $\omega_1$ of the resonance light 1 and a frequency $\omega_2$ of the resonance light 2.

When the difference ($\omega_1$-$\omega_2$) between the frequency $\omega_1$ of the resonance light 1 and the frequency $\omega_2$ of the resonance light 2 coincides with a frequency $\omega_0$ equivalent to an energy difference between the base state 1 and the base state 2, excitations from the base states 1 and 2 to an excitation state are respective stopped. At this point, both of the resonance lights 1 and 2 are transmitted through the alkali metal without being absorbed. Such a phenomenon is referred to as coherent population trapping (CPT) or electromagnetically induced transparency (EIT).

For example, the light source section 21 fixes the frequency $\omega_1$ of the resonance light 1 and changes the frequency $\omega_2$ of the resonance light 2. Then, when the difference (($\omega_1$-$\omega_2$) between the frequency $\omega_1$ of the resonance light 1 and the frequency $\omega_2$ of the resonance light 2 coincides with the frequency $\omega_0$ equivalent to the energy difference between the base state 1 and the base state 2, the detection intensity of the light receiving section 32 steeply increases as shown in FIG. 3. Such a steep signal is detected as an EIT signal. The EIT signal has an eigenvalue determined according to a type of the alkali metal. Therefore, it is possible to configure a highly accurate oscillator by using the EIT signal as a reference signal.

The specific configuration of the atomic oscillator 1 in this embodiment is explained.

Figure 4:
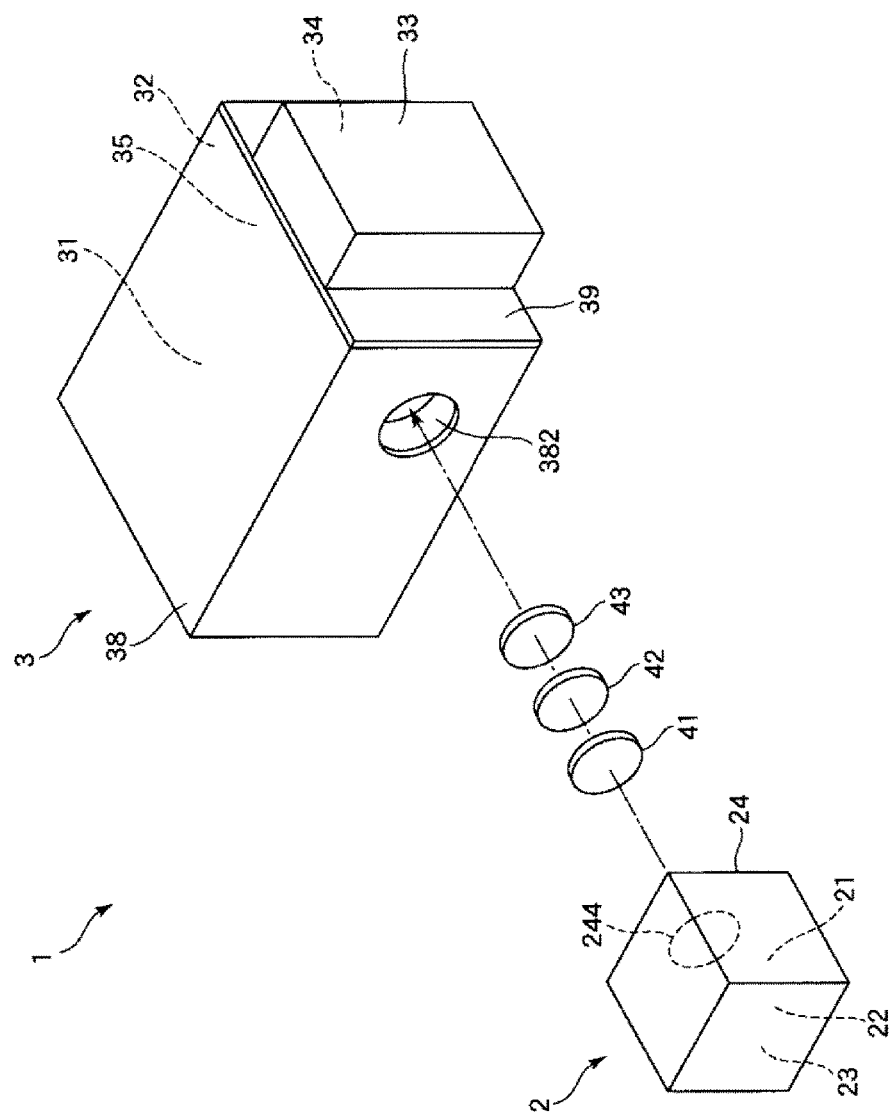
FIG. 4 is a schematic perspective view of the atomic oscillator shown in FIG. 1.
Figure 5:
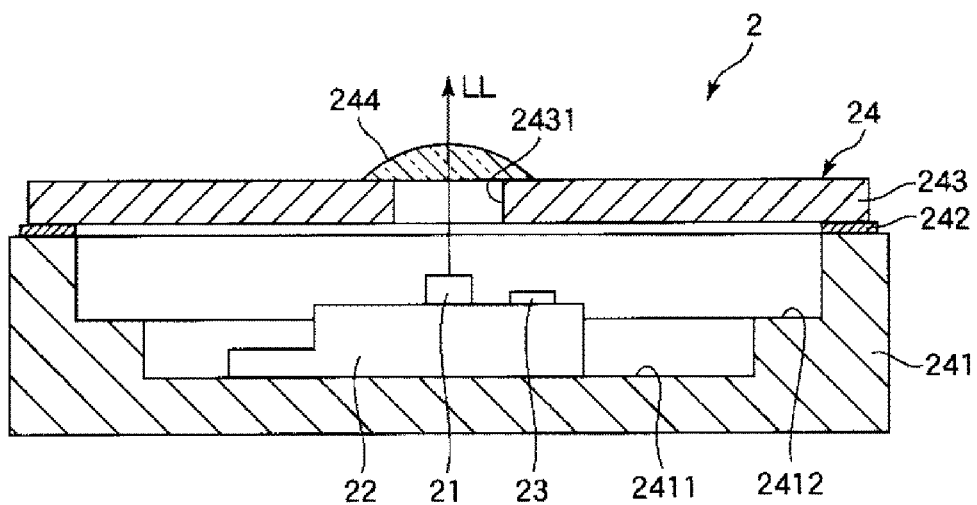
FIG. 5 is a sectional view of a light source side unit included in the atomic oscillator shown in FIG. 1.

FIG. 4 is a schematic perspective view of the atomic oscillator shown in FIG. 1. FIG. 5 is a sectional view of the light source side unit included in the atomic oscillator shown in FIG. 1. Note that, in the following explanation, for convenience of explanation, the upper side in FIG. 5 is referred to as "upper" and the lower side in FIG. 5 is referred to as "lower".

As explained above, the atomic oscillator 1 includes the light source side unit 2, the cell side unit 3, the optical components 41, 42, and 43 provided between the units 2 and 3, and the control section 6. The light source side unit 2, the cell side unit 3, and the optical components 41, 42, and 43 are supported by a not-shown wiring board in an arrangement state shown in FIG. 4. The control section 6 is mounted on the wiring board and electrically connected to the light source side unit 2 and the cell side unit 3 respectively via not-shown wires, connectors, and the like.

The sections of the atomic oscillator 1 are sequentially explained below.

Light Source Side Unit

As explained above, the light source side unit 2 includes the light source section 21, the temperature adjusting element 22, and the temperature sensor 23. The light source side unit 2 includes, as shown in FIGS. 4 and 5, a light source side package 24 that houses the light source section 21, the temperature adjusting element 22, and the temperature sensor 23.

Light Source Section

The light source section 21 has a function of emitting the light LL including a resonance light pair for causing alkali metal atoms in the atomic cell 31 to resonate.

More specifically, the light source section 21 emits the light LL including the two kinds of light (the resonance light pair including the resonance light 1 and the resonance light 2) having the different frequencies. The frequency $\omega1$ of the resonance light 1 can excite the alkali metal in the atomic cell 31 from the base state 1 to the excited state (cause the alkali metal to resonate). The frequency $\omega2$ of the resonance light 2 can excite the alkali metal in the atomic cell 31 from the base state 2 to the excited state (cause the alkali metal to resonate).

The light source section 21 is not particularly limited as long as the light source section 21 can emit the light LL explained above. For example, a semiconductor laser such as a vertical cavity surface emitting laser (VCSEL) can be used.

Temperature Adjusting Element

The temperature adjusting element 22 functions as a "temperature adjusting section" that adjusts the temperature of the light source section 21. In this embodiment, the temperature adjusting element 22 is a Peltier element. The Peltier element includes a pair of surfaces, one of which a surface on a heat generating side (a heat generating surface) and the other of which is a surface on a heat absorbing side (a heat absorbing surface). The Peltier element can switch the heat generating surface and the heat absorbing surface by controlling a direction of a supplied electric current. Therefore, even if a range of an environmental temperature is wide, it is possible to adjust the temperature of the light source section 21 to a desired temperature.

Note that the temperature adjusting element 22 is not limited to the Peltier element and may be, for example, a heating resistor (a heater).

Temperature Sensor

The temperature sensor 23 has a function of detecting the temperature of the light source section 21 or the temperature adjusting element 22. The temperature sensor 23 is not particularly limited. For example, a thermistor and a thermocouple can be used.

Light Source Side Package

The light source side package 24 houses the light source section 21, the temperature adjusting element 22, and the temperature sensor 23.

As shown in FIG. 5, the light source side package 24 includes a base 241 including a recess 2411 opened to the upper surface and a lid 243 that is joined to the base 241 via a metalize layer 242 and closes the opening of the recess 2411. Consequently, the inner side of the recess 2411 closed by the lid 243 functions as a housing space for housing the light source section 21, the temperature adjusting element 22, and the temperature sensor 23. The housing space is desirably in a decompressed (vacuum) state. Consequently, it is possible to reduce the influence of a temperature change outside the light source side package 24 on the light source section 21 and the temperature sensor 23 in the light source side package 24 and reduce temperature fluctuation of the light source section 21, the temperature sensor 23, and the like in the light source side package 24. Note that the inside of the light source side package 24 does not have to be in the decompressed state. An inert gas such as nitrogen, helium, or argon may be encapsulated in the light source side package 24.

A constituent material of the base 241 is not particularly limited. A material having insulation and suitable for forming the housing space as an air-tight space, for example, various ceramics including oxide-based ceramics such as alumina, silica, titania, and zirconia, nitride-based ceramics such as silicon nitride, aluminum nitride, and titanium nitride, and carbide-based ceramics such as silicon carbide can be used. Note that a metal material same as a metal material of the lid 243 can also be used as the constituent material of the base 241.

The base 241 includes a step section 2412 formed further on the upper side than the bottom surface of the recess 2411. Although not shown in the figure, in the step section 2412, a pair of connection electrodes electrically connected to the temperature adjusting element 22, a pair of connection electrodes electrically connected to the light source section 21, and a pair of connection electrodes electrically connected to the temperature sensor 23 is provided. The connection electrodes are respectively electrically connected to, via through-electrodes, external mounting electrodes provided on the lower surface of the base 241. A constituent material of the connection electrodes, the external mounting electrodes, and the through-electrodes is not particularly limited. For example, metal materials such as gold (Au), a gold alloy, platinum (Pt), aluminum (Al), an aluminum alloy, silver (Ag), a silver alloy, chrome (Cr), a chrome alloy, nickel (Ni), copper (Cu), molybdenum (Mo), niobium (Nb), tungsten (W), iron (Fe), titanium (Ti), cobalt (Co), zinc (Zn), and zirconium (Zr) can be used.

The frame-like metalize layer 242 is provided on the upper end face of the base 241. The metalize layer 242 improves adhesion to a brazing material. Consequently, it is possible to increase joining strength of the base 241 and the lid 243 by the brazing material.

A constituent material of the metalize layer 242 is not particularly limited as long as the constituent material can improve adhesion to the brazing material. For example, the metal materials described above as the constituent material of the connection electrodes and the like can be used.

The lid 243 is formed in a flat shape. A through-hole 2431 is formed in the lid 243. The through-hole 2431 is sealed by a window member 244 having transmissivity to the light LL.

A constituent material of the lid 243 is not particularly limited. Metal materials are suitably used. Among the metal materials, metal materials having coefficients of linear expansion approximate to a coefficient of linear expansion of the constituent material of the base 241 are desirably used. Therefore, for example, when the base 241 is a ceramic substrate, an alloy such as kovar is desirably used as the constituent material of the lid 243.

The lid 243 is joined to the base 241 by welding to the metalize layer 242 using a brazing material. The brazing material is not particularly limited. For example, gold solder and silver solder can be used.

The window member 244 is disposed on an optical path of the light emitted from the light source section 21. The window member 244 is made of, for example, a glass material and has transmissivity to the light LL. In this embodiment, the window member 244 is a lens. Consequently, it is possible to irradiate the light LL on the atomic cell 31 without waste. The window member 244 has a function of changing the light LL to parallel light. That is, the window member 244 is a collimate lens. The light LL in the atomic cell 31 is parallel light. Consequently, among atoms of the alkali metal present in the atomic cell 31, the number of atoms of the alkali metal caused to resonate by the light LL emitted from the light source section 21 can be increased. As a result, it is possible to increase the intensity of the EIT signal.

Note that the window member 244 is not limited to the lens as long as the window member 244 has transmissivity to the light LL. For example, the window member 244 may be an optical component other than the lens or may be a mere light-transmissive tabular member. In this case, the lens having the functions explained above may be provided, for example, between the light source side unit 2 and the cell side unit 3 like the optical components 41, 42, and 43 explained below.

The temperature adjusting element 22 is disposed on the bottom surface of the recess 2411 of the base 241 of the light source side package 24. The temperature adjusting element 22 is fixed to the base 241 by, for example, an adhesive.

In the temperature adjusting element 22, one surface (the lower surface) of the pair of surfaces forming the heat generating surface and the heat absorbing surface is fixed to the base 241. On the other hand, the light source section 21 and the temperature sensor 23 are set on the other surface (the upper surface) of the temperature adjusting element 22.

Although not shown in the figure, the light source section 21, the temperature adjusting element 22, and the temperature sensor 23 disposed in this way are respectively electrically connected to, via wires such as bonding wires, the connection electrodes provided in the light source side package 24.

Cell Side Unit

As explained above, the cell side unit 3 includes the atomic cell 31, the light receiving section 32, the heater 33, the temperature sensor 34, and the coil 35. The cell side unit 3 includes, as shown in FIG. 4, a magnetic shield 38 that houses the atomic cell 31, the light receiving section 32, and the coil 35.

Atomic Cell

In the atomic cell 31, gaseous alkali metal such as rubidium, cesium, or sodium is encapsulated. In the atomic cell 31, a rare gas such as argon or neon or an inert gas such as nitrogen is encapsulated as a buffer gas together with the alkali metal gas according to necessity.

Although not shown in the figure, for example, the atomic cell 31 includes a body section including a through-hole and a pair of window sections that seals both openings of the through-hole. Consequently, an internal space in which the alkali metal is encapsulated is formed. A material forming the body section is not particularly limited. Examples of the material include a metal material, a resin material, a glass material, a silicon material, and quartz. From the viewpoint of machinability and joining to the window sections, the glass material or the silicon material is desirably used. A material forming the window sections is not particularly limited as long as the material has transmissivity to the light LL. Examples of the material include a silicon material, a glass material and quartz. The body section and the window sections are air-tightly joined. A method for the joining is determined according to these constituent materials and is not particularly limited. For example, a joining method by an adhesive, a direct joining method, and an anodic joining method can be used.

Light Receiving Section

The light receiving section 32 has a function of detecting the intensity of the light LL (the resonance lights 1 and 2) transmitted through the atomic cell 31.

The light receiving section 32 is not particularly limited as long as the light receiving section 32 can detect the light LL. For example, photodetectors (light receiving elements) such as a solar cell and a photodiode can be used.

In this embodiment, the light receiving section 32 is housed in the magnetic shield 38. However, the light receiving section 32 may be provided on the outer side of the magnetic shield 38. In this case, a window section through which the light LL passed through the atomic cell 31 is transmitted only has to be provided in the magnetic shield 38.

Coil

The coil 35 has a function of generating, with energization, a magnetic field in a direction along (a direction parallel to) an axis "a" of the light LL in the gas cell 31. Consequently, it is possible to expand, through Zeeman splitting, a gap between degenerated different energy levels of atoms of the alkali metal present in the gas cell 31, improve resolution, and reduce a line width of the EIT signal.

Note that the magnetic field generated by the coil 35 may be one of a direct-current magnetic field and an alternating-current magnetic field or may be a magnetic field obtained by superimposing the direct-current magnetic field and the alternating-current magnetic field.

The coil 35 is not particularly limited. For example, the coil 35 may be provided to be wound along the outer circumference of the atomic cell 31 to configure a solenoid type or a pair of coils may be opposed to each other via the atomic cell 31 to configure a Helmholtz type.

Magnetic Shield

The magnetic shield 38 is configured by a housing, the external shape of which is formed in a block shape. The magnetic shield 38 houses the atomic cell 31, the light receiving section 32, and the coil 35 on the inside. The magnetic shield 38 has a magnetic shield property a function of shielding the alkali metal in the atomic cell 31 from an external magnetic field. Consequently, it is possible to attain improvement of stability of the magnetic field of the coil 35 in the magnetic shield 38. Therefore, it is possible to attain improvement of an oscillation characteristic of the atomic oscillator 1.

In a wall section of the magnetic shield 38 on the light source side unit 2 side, a window section 382 that pierces through the wall section in the thickness direction thereof is provided. Consequently, the light LL emitted from the light source section 21 can be made incident in the atomic cell 31 via the window section 382.

As a constituent material of the magnetic shield 38, a material having a magnetic shield property is used. Examples of the constituent material include soft magnetic materials such as Fe and various iron-based alloys (ferro-silicon, permalloy, amorphous, Sendust, and kovar). Among the soft magnetic materials, from the viewpoint of an excellent magnetic shield property, Fe—Ni-based alloys such as kovar and permalloy are desirably used.

For example, a plurality of leads (not shown in the figure) project from the magnetic shield 38. The leads are electrically connected to the light receiving section 32, the heater 33, the temperature sensor 34, and the coil 35 via wires.

Heater

The heater 33 has a function of heating the atomic cell 31 (more specifically, the alkali metal in the atomic cell 31). Consequently, it is possible to maintain the alkali metal in the atomic cell 31 in a state of gas having desired concentration.

The heater 33 generates heat with energization. The heater 33 is configured by, for example, a heating resistor.

On the outer side of the magnetic shield 38, the heater 33 is connected to the magnetic shield 38 via a heat exchanger plate 39 having relatively high thermal conductivity. By providing the heater 33 on the outer side of the magnetic shield 38 in this way, it is possible to effectively suppress a magnetic field generated from the heater 33 from affecting the magnetic field generated by the coil 35 in the atomic cell 31.

Note that the atomic cell 31 may be heated using a Peltier element instead of or together with the heater 33.

Temperature Sensor

The temperature sensor 34 detects the temperature of the heater 33 or the atomic cell 31.

A setting position of the temperature sensor 34 is not particularly limited. For example, the temperature sensor 34 may be set on the heater 33 or may be set on the outer surface of the atomic cell 31.

The temperature sensor 34 is not particularly limited. Publicly-known various temperature sensors such as a thermistor and a thermocouple can be used.

Optical Components

The plurality of optical components 41, 42, and 43 are disposed between the light source side unit 2 and the cell side unit 3. The optical components 41, 42, and 43 are provided on the optical axis (the axis "a") between the light source section 21 in the light source side package 24 and the atomic cell 31. In this embodiment, the optical component 41, the optical component 42, and the optical component 43 are disposed in this order from the light source side unit 2 side to the cell side unit 3 side.

The optical component 41 is a $\lambda/4$ wavelength plate. Consequently, for example, when a resonance light pair from the light source section 21 is linearly polarized light, it is possible to convert the resonance light pair into circularly polarized light (right circularly polarized light or left circularly polarized light).

In a state in which the alkali metal atoms in the atomic cell 31 are Zeeman-split by the magnetic field of the coil 35 as explained above, if the resonance light pair of the linearly polarized light is irradiated on the alkali metal atoms, the alkali metal atoms are uniformly distributed and present in a Zeeman-split plurality of levels according to an interaction of the resonance light pair and the alkali metal atoms. As a result, the number of the alkali metal atoms in a desired energy level is relatively small with respect to the number of the alkali metal atoms of the other energy levels. Therefore, the number of atoms that develop desired EIT decreases. A desired EIT signal decreases in magnitude. As a result, an oscillation characteristic of the atomic oscillator 1 is deteriorated.

On the other hand, the state in which the alkali metal atoms in the atomic cell 31 are Zeeman-split by the magnetic field of the coil 35 as explained above, if the resonance light pair of the circularly polarized light is irradiated on the alkali metal atoms, among a plurality of levels of the Zeeman-split alkali metal atoms, it is possible to set the number of the alkali metal atoms of a desired energy level relatively large with respect to the number of the alkali metal atoms of the other energy levels. Therefore, the number of atoms that develop the desired EIT increases and the desired EIT signal increases in magnitude. As a result, it is possible to improve the oscillation characteristic of the atomic oscillator 1.

Note that the plan view shape of the optical component 41 is not limited to the above. For example, the optical component 41 may be formed in, for example, a polygonal shape such as a square shape or a pentagonal shape.

The optical components 42 and 43 are disposed on the cell side unit 3 side to correspond to the optical component 41.

The optical components 42 and 43 are respectively dimmer filters (ND filters). Consequently, it is possible to adjust (reduce) the intensity of the light LL made incident on the atomic cell 31. Therefore, even when an output of the light source section 21 is large, it is possible to set the resonance light pair made incident on the atomic cell 31 to a desired light amount. In this embodiment, the intensity of the resonance light pair converted into the circularly polarized light by the optical component 41 is adjusted by the optical components 42 and 43.

In this embodiment, the optical components 42 and 43 are respectively formed in tabular shapes.

Note that the plan view shape of the optical components 42 and 43 is not limited to this. The optical components 42 and 43 may be formed in, for example, a polygonal shape such as a square shape or a pentagonal shape.

In the optical component 42 and the optical component 43, dimming ratios may be equal to each other or may be different from each other.

The optical components 42 and 43 may respectively include portions where dimming ratios are different continuously or stepwise on the upper side and the lower side. In this case, it is possible to adjust a dimming ratio of the resonance light pair by, for example, adjusting positions in the up-down direction of the optical components 42 and 43 with respect to the wiring board.

The optical components 42 and 43 may respectively include portions where dimming ratios are continuously or discontinuously different in the circumferential direction. In this case, by rotating the optical components 42 and 43, it is possible to adjust the dimming ratios of the resonance light pair. Note that, in this case, the rotation centers of the optical components 42 and 43 only have to deviate from the axis "a".

Note that one of the optical components 42 and 43 may be omitted. When an output of the light source section 21 is moderate, both of the optical components 42 and 43 can be omitted.

The optical components 41, 42, and 43 are not limited to the type, the disposition order, the number, and the like explained above. For example, the optical components 41, 42, and 43 are not respectively limited the λ/4 wavelength plates or the dimming filters and may be lenses, polarizing plates, or the like.

Control Section

The control section 6 shown in FIG. 1 has functions of respectively controlling the light source section 21, the temperature adjusting element 22, the heater 33, and the coil 35.

In this embodiment, the control section 6 is configured by an IC (Integrated Circuit) chip.

The control section 6 includes a light-source control section 61 that controls the frequency of the resonance lights 1 and 2 of the light source section 21, a cell-temperature control section 62 that controls the temperature of the atomic cell 31, a magnetic-field control section 63 that controls a magnetic field applied to the atomic cell 31, a bias detecting section 64 that detects bias information supplied to the light source section 21, a light-source-temperature control section 65 that controls the temperature adjusting element 22, and a storing section 66 having stored therein a reference value of a bias and the like.

The light-source control section 61 controls, on the basis of a detection result of the light receiving section 32, the frequencies of the resonance lights 1 and 2 emitted from the light source section 21. More specifically, the light-source control section 61 controls, on the basis of the detection result of the light receiving section 32, the frequencies of the resonance lights 1 and 2 emitted from the light source section 21 to adjust the frequency difference ($\omega_1-\omega_2$) to the frequency $\omega_0$ peculiar to the alkali metal.

Although not shown in the figure, the light-source control section 61 includes a voltage controlled crystal oscillator (VCXO) and a phase locked loop (PLL). The light-source control section 61 detects an EIT state in the atomic cell 31 on the basis of the light reception intensity of the light receiving section 32 and controls the voltage controlled crystal oscillator according to a result of the detection. Consequently, the voltage controlled crystal oscillator is controlled to have a desired oscillation frequency and oscillates at a frequency of, for example, approximately several megahertz to several tens megahertz. An output signal of the voltage controlled crystal oscillator is input to the phase locked loop and output as an output signal of the atomic oscillator 1. The phase locked loop frequency-multiplies the output signal from the voltage controlled crystal oscillator. Consequently, the phase locked loop oscillates at a half frequency of the frequency equivalent to the energy difference between the two different base levels of the alkali metal atoms. The signal multiplied in this way (a high-frequency signal) is superimposed with a bias (a direct-current bias current) and then input to the light source section 21 as a driving signal. Consequently, it is possible to modulate the light emitting element included in the light source section 21 and emit the resonance light pair, the frequency difference ($\omega_1-\omega_2$) of which is the frequency $\omega_0$.

The light-source control section 61 controls, on the basis of the light reception intensity of the light receiving section 32, a bias supplied to the light source section 21. Consequently, it is possible to desirably control the center wavelength of the resonance light pair.

The cell-temperature control section 62 controls energization to the heater 33 on the basis of a detection result of the temperature sensor 34. Consequently, it is possible to maintain the atomic cell 31 within a desired temperature range.

The magnetic-field control section 63 controls energization to the coil 35 to fix the magnetic field generated by the coil 35.

The bias detecting section 64 has a function of detecting bias information (information concerning a bias of the light source section 21) from the light-source control section 61.

The light-source-temperature control section 65 has a function of controlling the temperature adjusting element 22 on the basis of a detected temperature of the temperature sensor 23 and a function of controlling the temperature adjusting element 22 using the information (the bias information) detected by the bias detecting section 64. The light-source-temperature control section 65 usually controls, on the basis of the detected temperature of the temperature sensor 23, the temperature adjusting element 22 to adjust the light source section 21 to a set temperature. The light-source-temperature control section 65 changes the set temperature at every predetermined time or when a bias value exceeds the reference value.

The storing section 66 stores therein the reference value of the bias and the like. The reference value of the bias stored in the storing section 66 includes information concerning at least one of a bias current and a bias voltage. In the storing section 66, a table in which bias values (bias currents or bias voltages) and set temperatures are associated with each other is stored. The table is used for changing the set temperature of the temperature control section 65 as explained below. The storing section 66 may have a function of storing the bias information (a history) detected by the bias detecting section 64.

The sections of the atomic oscillator 1 are explained above.

Bias Control and Temperature Control for the Light Source Section

Bias control and temperature control for the light source section 21 will be explained below in detail.

Figure 6A:
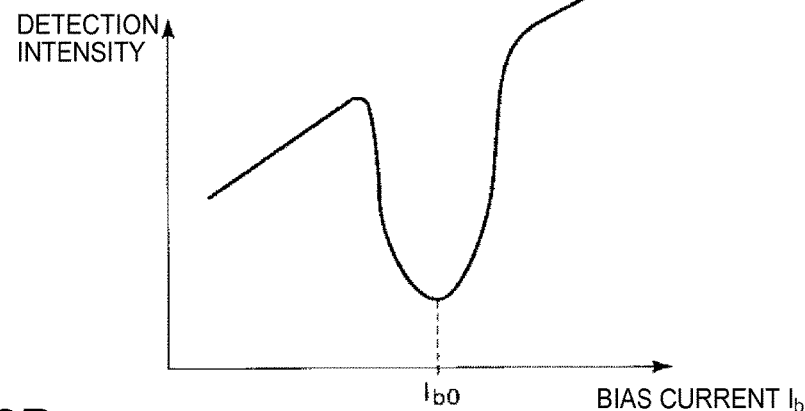
FIG. 6A is a graph showing a relation between a bias current of the light source section and detection intensity of the light receiving section.
Figure 6B:
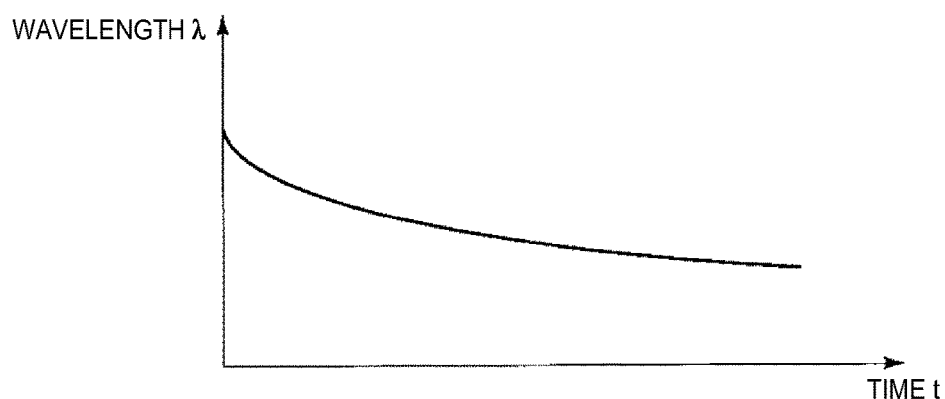
FIG. 6B is a graph showing a change with time of a light emission wavelength that changes when the temperature of the light source section is fixed.
Figure 6C:
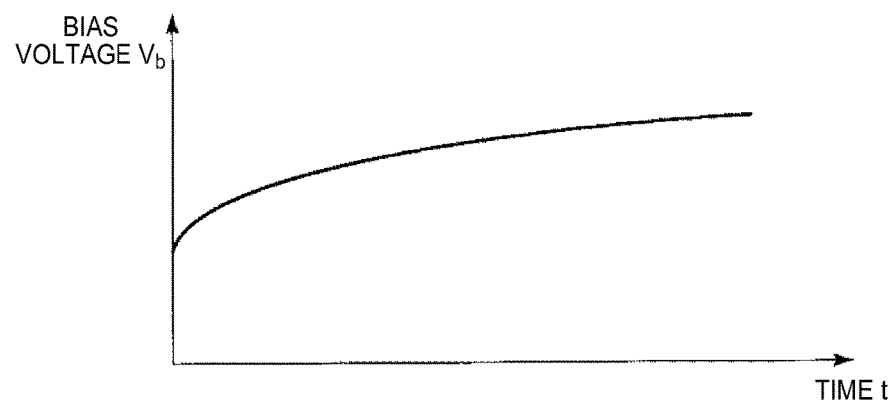
FIG. 6C is a graph showing a change with time of a bias voltage that changes when the temperature of the light source section is fixed.
Figure 7:
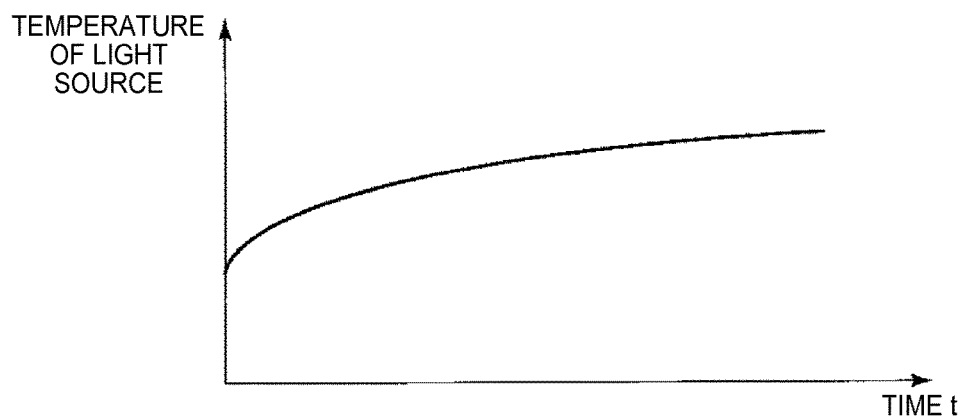
FIG. 7 is a graph showing a change with time of the temperature (set temperature) of the light source section controlled by a light-source-temperature control section.

FIG. 6A is a graph showing a relation between a bias current of the light source section and detection intensity of the light receiving section. FIG. 6B is a graph showing a change with time of a light emission wavelength that changes when the temperature of the light source section is fixed. FIG. 6C is a graph showing a change with time of a bias voltage that changes when the temperature of the light source section is fixed. FIG. 7 is a graph showing a change with time of the temperature (set temperature) of the light source section controlled by the light-source-temperature control section.

As explained above, the light-source control section 61 controls, on the basis of the light reception intensity of the light receiving section 32, the bias supplied to the light source section 21. Specifically, for example, the light-source control section 61 controls the bias to be a bias current $I_{b0}$ at the time when the detection intensity of the light receiving section 32 is minimized. Consequently, it is possible to desirably control the center wavelength of the resonance light pair. The light-source control section 61 functions as a "bias control section" that controls the bias to adjust the wavelength of the light LL emitted from the light source section 21 to a set value.

A surface emitting laser used in the light source section 21, which receives the supply of the bias current and emits light, generally has a characteristic that a light emission wavelength changes according to the bias current. However, the surface emitting laser has an aging characteristic in which, even if the bias current is fixed, the light emission wavelength changes (decreases) with time (gradually over a long period) as shown in FIG. 6B. Therefore, simply by controlling the bias current to fix the light emission wavelength, as shown in FIG. 6C, the bias voltage changes (increases) and an amount of emitted light also changes (increases) according to the change in the bias voltage. When the amount of emitted light of the light source section 21 changes, frequency stability (in particular, long-term frequency stability) is deteriorated because of the influence of a phenomenon called light shift in which the resonance frequency of the alkali metal changes according to a change in the density of an amount of light irradiated on the alkali metal in the atomic cell 31.

On the other hand, the surface emitting laser has a characteristic that the amount of emitted light hardly changes and the light emission wavelength changes according to temperature (a characteristic that the light emission wavelength is longer as the temperature is higher). Therefore, the light-source-temperature control section 65 controls the temperature adjusting element 22 using the bias information detected by the bias detecting section 64. Specifically, the light-source-temperature control section 65 adjusts the temperature of the light source section 21 to gradually rise as shown in FIG. 7 such that, even in a state in which the light emission wavelength of the light emitting section 21 is kept fixed, the light emission intensity of the light source section 21 is fixed. Consequently, it is possible to adjust the wavelength of the light LL while reducing fluctuation in the intensity of the light LL emitted from the light source section 21. Therefore, it is possible to reduce the light shift and, as a result, improve the frequency stability.

Figure 8:
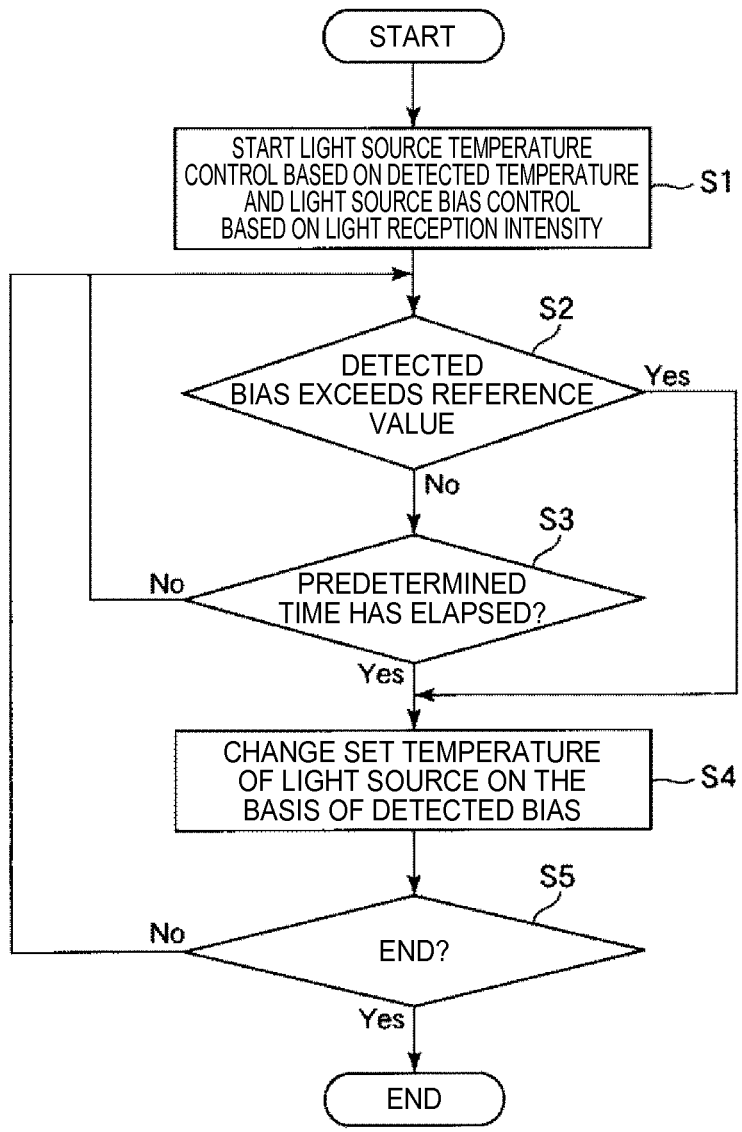
FIG. 8 is a flowchart for explaining control by the light-source-temperature control section and a bias control section.

FIG. 8 is a flowchart for explaining the control by the light-source-temperature control section and the bias control section.

As shown in FIG. 8, first, light source temperature control based on a detected temperature by the light-source-temperature control section 65 and light source bias control based on light reception intensity by the light-source control section 61 (the bias control section) are started (step S1). In the light source temperature control based on the detected temperature by the light-source-temperature control section 65, as explained above, the light-source control section 61 controls, on the basis of the light reception intensity of the light receiving section 32, a bias supplied to the light source section 21. In the light source bias control based on the light reception intensity by the light-source control section 61, the light-source-temperature control section 65 controls the temperature adjusting element 22 on the basis of a detected temperature of the temperature sensor 23 to adjust the temperature of the light source section 21 to the set temperature. In the bias control by the light-source control section 61 and the temperature control by the light-source-temperature control section 65, control time intervals (execution intervals) are not particularly limited. For example, the control time intervals are equal to or longer than 0.1 second and equal to or shorter than 1 second. Note that the control time intervals may be fixed or may be variable.

The light-source-temperature control section 65 compares bias information detected by the bias detecting section 64 and the reference value of the bias stored in the storing section 66 and determines, on the basis of a result of the comparison, whether the bias information detected by the bias detecting section 64 exceeds the reference value (step S2). Consequently, the light-source-temperature control section 65 determines whether the intensity of the light LL emitted from the light source section 21 exceeds a predetermined value.

When the bias information detected by the bias detecting section 64 does not exceed the reference value, the light-source-temperature control section 65 determines whether a predetermined time has elapsed (step S3). When the predetermined time has not elapsed, the light-source-temperature control section 65 returns to step S2. The "predetermined time" in step S3 is time longer than a time interval of bias control by the light-source control section 61.

A specific "predetermined time" in step S3, that is, a time interval for adjusting the set temperature in the light-source-temperature control section 65 is desirably within a range of time equal to or longer than 1000 seconds and equal to or shorter than 1000000 seconds, more desirably within a range of time equal to or longer than 10000 seconds and equal to or shorter than 1000000 seconds, and still more desirably within a range of time equal to or longer than 10000 seconds and equal to or shorter than 50000 seconds. Consequently, it is possible to perform the control by the light-source-temperature control section 65 while reducing an adverse effect on the short-term frequency stability. Note that the "predetermined time" in step S3 may be fixed or may be variable. However, when the predetermined time is variable, since a light amount change due to an aging characteristic of the light source section 21 becomes gentle as time elapses, the predetermined time desirably gradually increases.

On the other hand, when the bias information detected by the bias detecting section 64 exceeds the reference value or when the predetermined time has elapsed, the light-source control section 61 changes the set temperature of the light-source-temperature control section 65 using the bias information detected by the bias detecting section 64 (step S4). Specifically, the light-source control section 61 changes (raises) the set temperature on the basis of the bias information detected by the bias detecting section 64. For example, a table in which bias values and set temperatures are associated with each other is stored in the storing section 66 in advance. The light-source control section 61 changes, using the table, the set temperature to a set temperature corresponding to the bias information detected by the bias detecting section 64.

In this way, the light-source-temperature control section 65 controls the temperature adjusting element 22 using the comparison result of the bias information (the bias current or the bias voltage) detected by the bias detecting section 64 and the reference value (the reference value of the bias current or the bias voltage) stored in the storing section 66. Consequently, it is possible to efficiently adjust the bias to keep constant the intensity of the light LL emitted from the light source section 21.

After the set temperature is changed in this way, the light-source-temperature control section 65 determines whether to end the control (step S5). When not ending the control, the light-source-temperature control section 65 returns to step S2. On the other hand, when ending the control, the light-source-temperature control section 65 ends the control by the light-source control section 61 and the light-source temperature control section 65.

With the atomic oscillator 1 explained above, the light-source-temperature control section 65 controls the temperature adjusting element 22 using the bias information detected by the bias detecting section 64. Therefore, it is possible to adjust the wavelength of the light LL while reducing fluctuation in the intensity of the light LL emitted from the light source section 21. Therefore, it is possible to reduce the phenomenon called light shift in which the resonance frequency of the alkali metal atoms changes according to a change in the intensity (the density) of the light LL irradiated on the alkali metal atoms in the atomic cell 31. As a result, it is possible to improve the frequency stability (in particular, the long-term frequency stability).

In particular, in the atomic oscillator 1, usually, while the light-source-temperature control section 65 controls the temperature adjusting element 22 to adjust the light source section 21 to the set temperature (the fixed temperature), the light-source control section 61 (the bias control section) controls the bias to adjust the wavelength of the light LL emitted from the light source section 21 to the set value. Therefore, it is possible to improve the short-term frequency stability.

The light-source-temperature control section 65 adjusts, at the time interval longer than the control time interval of the light-source control section 61, the set temperature using the bias information detected by the bias detecting section 64. Consequently, it is possible to improve both of the short-term frequency stability and the long-term frequency stability.

On the other hand, when the time interval for adjusting the set temperature is too short, deterioration in the short-term frequency stability is caused. This is because, whereas the responsiveness of the bias control by the light-source control section 61 (the bias control section) is high, the responsiveness of the temperature control by the light-source-temperature control section 65 is low. Since the aging characteristic of the light source section 21 gradually occurs over a relatively long time, even if the time interval for adjusting the set temperature is relatively long, it is possible to improve the long-term frequency stability. On the other hand, when the time interval for adjusting the set temperature is too long, the bias control by the light-source control section 61 is performed over a long period while the temperature of the light source section 21 is fixed. Therefore, by the influence of change in the light emission wavelength of the light source section 21 due to the aging characteristic, a fluctuation amount of the bias increases and the fluctuation in the emitted light amount of the light source section 21 increases.

Second Embodiment

A second embodiment of the invention is explained below.

Figure 9:
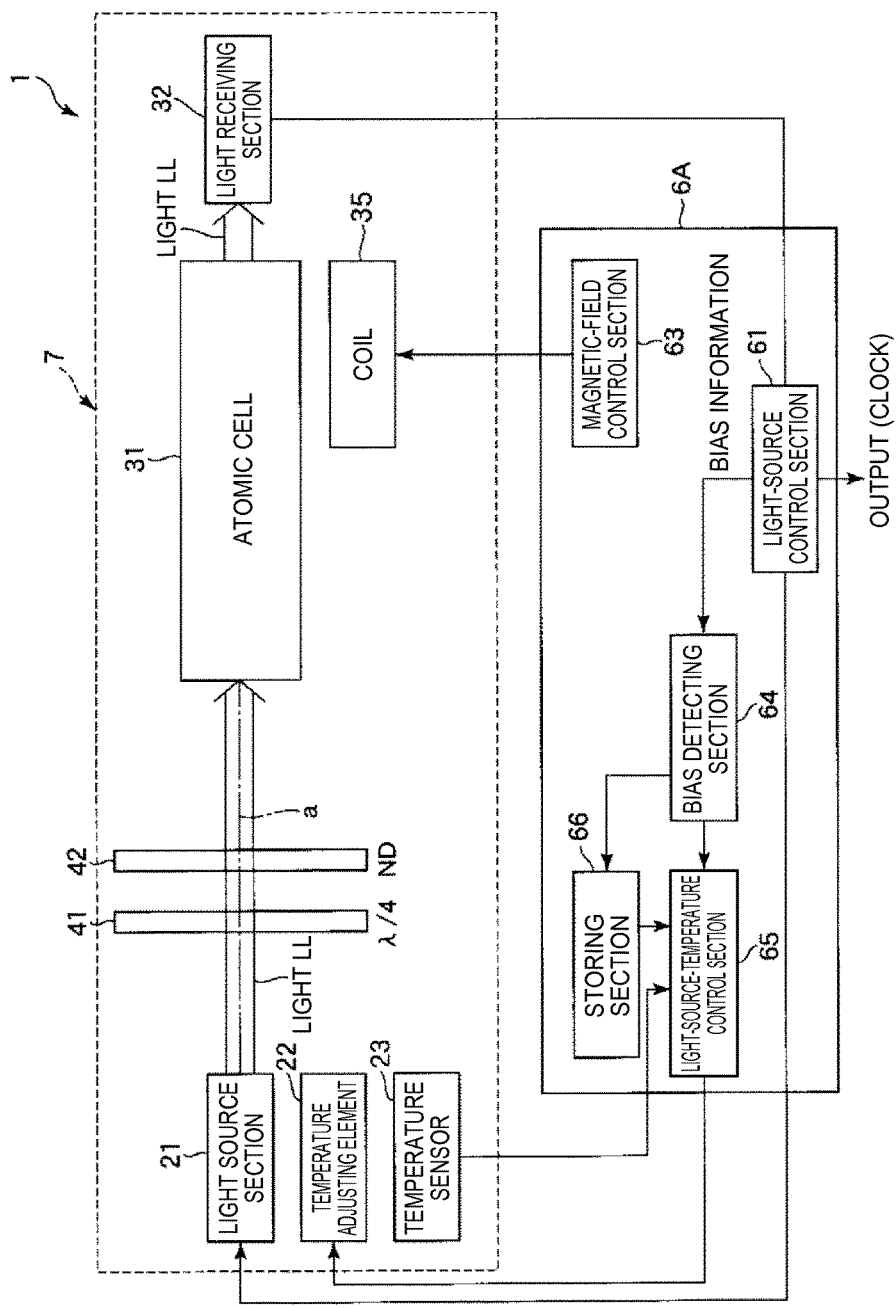
FIG. 9 is a schematic diagram showing the schematic configuration of an atomic oscillator (a quantum interference device) according to a second embodiment of the invention.
Figure 10:
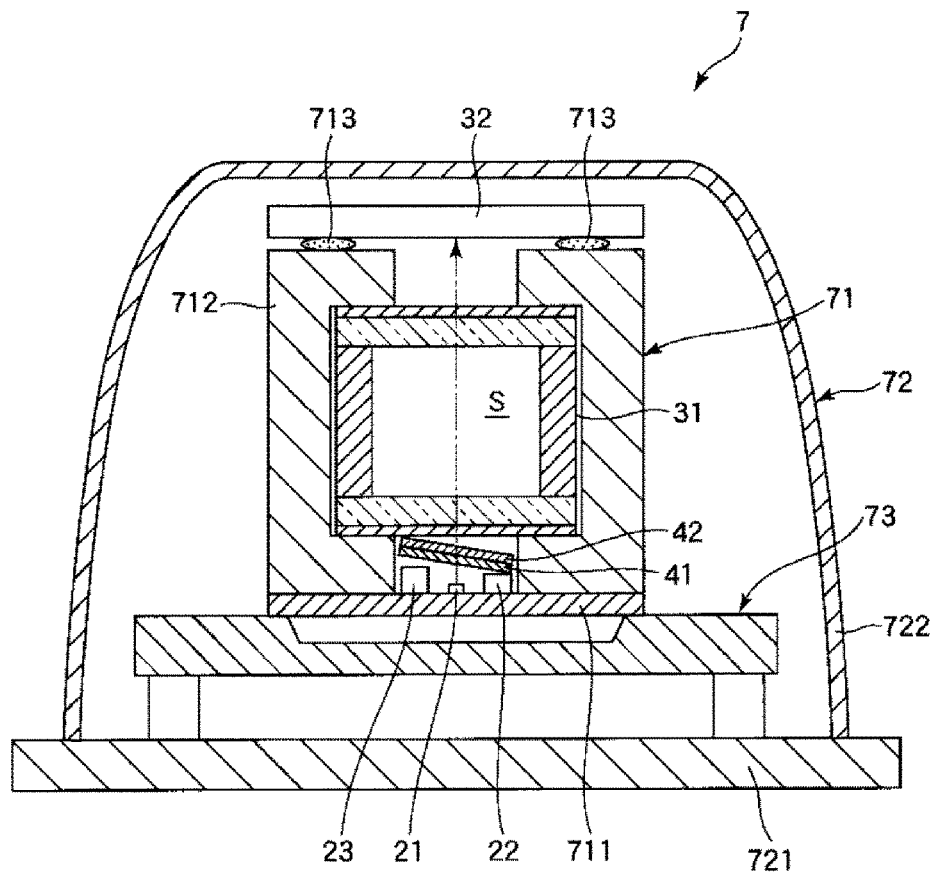
FIG. 10 is a sectional view of a physical unit included in the atomic oscillator shown in FIG. 9.

FIG. 9 is a schematic diagram showing the schematic configuration of an atomic oscillator (a quantum interference device) according to the second embodiment of the invention. FIG. 10 is a sectional view of a physical unit included in the atomic oscillator shown in FIG. 9.

This embodiment is the same as the first embodiment except that components on a light source side and components on an atomic cell side are integrated as one package and the configuration of the atomic oscillator is simplified according to the packaging of the components.

Note that, in the following explanation, concerning the second embodiment, differences from the first embodiment are mainly explained. Explanation concerning the similarities is omitted. In FIGS. 9 and 10, components same as the components in the first embodiment are denoted by the same reference numerals and signs.

The atomic oscillator 1 shown in FIG. 9 includes a physical unit 7 and a control section 6A that controls the physical unit 7.

Physical Unit

As shown in FIG. 9, the physical unit 7 includes the light source section 21, the temperature adjusting element 22, the temperature sensor 23, the optical components 41 and 42, the atomic cell 31, the light receiving section 32, and the coil 35. The physical unit 7 includes a package 72 that houses a main section 71, which includes the atomic cell 31, the light source section 21, the optical components 41 and 42, the light receiving section 32, the temperature adjusting element 22, and the temperature sensor 23, and a supporting member 73 that supports the main section 71 in the package 72. Note that, although not shown in the figure, the coil 35 is disposed to surround the main section 71 inside or outside the package 72. A magnetic shield may be provided on the outer side of the package 72 according to necessity.

The main section 71 includes the atomic cell 31, the light source section 21, the optical components 41 and 42, the light receiving section 32, the temperature adjusting element 22, the temperature sensor 23, a substrate 711, and connecting members 712. These components are integrated as a unit. Specifically, the light source section 21, the temperature adjusting element 22, the temperature sensor 23, and the connecting members 712 are mounted on the upper surface of the substrate 711. The atomic cell 31 and the optical components 41 and 42 are held by the connecting members 712. The light receiving section 32 is joined to the connecting members 712 via adhesives 713.

In this embodiment, the temperature adjusting element 22 and the temperature sensor 23 are used for temperature control of the atomic cell 31 as well.

Specifically, as explained above, the temperature adjusting element 22 is provided on the substrate 711. Heat from the temperature adjusting element 22 is transmitted to the atomic cell 31 via the substrate 711 and the connecting members 712. Consequently, the atomic cell 31 (more specifically, the alkali metal in the atomic cell 31) is heated. The alkali metal in the atomic cell 31 can be maintained in a state of gas having desired concentration. In this embodiment, the heat from the temperature adjusting element 22 is transmitted to the light source section 21 as well via the substrate 711.

The temperature adjusting element 22 is separated from the atomic cell 31. Consequently, it is possible to suppress an unnecessary magnetic field generated by energization to the temperature adjusting element 22 from adversely affecting metal atoms in the atomic cell 31.

In this embodiment, the temperature sensor 23 is provided on the substrate 711. Therefore, the temperature sensor 23 detects the temperature of the temperature adjusting element 22 via the substrate 711. Alternatively, the temperature sensor 23 detects the temperature of the atomic cell 31 via the substrate 711 and the connecting members 712.

Note that a setting position of the temperature sensor 23 is not limited to the above. For example, the temperature sensor 23 may be set on the connecting members 712, may be set on the temperature adjusting element 22, or may be set on the outer surface of the atomic cell 31.

The connecting members 712 thermally connect the temperature adjusting element 22 and the window sections of the atomic cell 31. Consequently, it is possible to transmit the heat from the temperature adjusting element 22 to the window section through heat conduction by the connecting members 712 and heat the window sections. The temperature adjusting element 22 and the atomic cell 31 can be separated. Therefore, it is possible to suppress the unnecessary magnetic field generated by the energization to the temperature adjusting element 22 from adversely affecting the alkali metal atoms in the atomic cell 31. The number of temperature adjusting elements 22 can be reduced. Therefore, for example, it is possible to reduce the number of wires for the energization to the temperature adjusting element 22. As a result, it is possible to attain a reduction in the size of the atomic oscillator 1.

Note that a gap may be formed between the connecting members 712 and at least one window section of the atomic cell 31. In this case, an adhesive having thermal conductivity is desirably filled in the gap. Consequently, it is possible to thermally connect the window sections and the connecting members 712. Examples of the adhesive include metal paste, a resin-based adhesive containing a heat conductive filler, and a silicone resin-based adhesive.

The connecting members 712 are respectively disposed with gaps formed between the connecting members 712 and the body section of the atomic cell 31. Consequently, it is possible to suppress transmission of heat between the connecting members 712 and the body section of the atomic cell 31 and efficiently perform transmission of the heat from the connecting members 712 to the window sections.

A constituent material of the connecting members 712 only has to be a material having thermal conductivity higher than the thermal conductivity of the material forming the atomic cell 31. However, a material excellent in thermal conductivity, for example, a metal material is desirably used. Like the package 72 explained below, a nonmagnetic material is desirably used as the constituent material of the connecting members 712 not to hinder the magnetic field from the coil 35.

The substrate 711 has a function of supporting the light source section 21, the temperature adjusting element 22, the temperature sensor 23, the connecting members 712, and the like. The substrate 711 has a function of transmitting the heat from the temperature adjusting element 22 to the connecting members 712. Consequently, even if the temperature adjusting element 22 is separated from the connecting members 712, it is possible to transmit the heat from the temperature adjusting element 22 to the connecting members 712.

The substrate 711 thermally connects the temperature adjusting element 22 and the connecting members 712. By mounting the temperature adjusting element 22 and the connecting members 712 on the substrate 711 in this way, it is possible to improve a degree of freedom of the setting of the temperature adjusting element 22.

Since the light source section 21 is mounted on the substrate 711, it is possible to adjust the temperature of the light source section 21 on the substrate 711 with the heat from the temperature adjusting element 22.

The substrate 711 includes wires (not shown in the figure) electrically connected to the light source section 21, the temperature adjusting element 22, and the temperature sensor 23.

A constituent material of the substrate 711 is not particularly limited. Examples of the constituent material include a ceramics material and a metal material. One kind of the materials can be used alone or two or more kinds of the materials can be used in combination. Note that, when the surface of the substrate 711 is made of the metal material, it is possible to increase the reflectance of heat on the surface of the substrate 711 and suppress radiation of the heat from the substrate 711. When the substrate 711 is made of the metal material, on the surface of the substrate 711, for example, an insulating layer made of a resin material, a metal oxide, a metal nitride, or the like may be provided according to necessity for the purpose of, for example, prevention of a short circuit of the wires of the substrate 711.

Like the package 72 explained below, a nonmagnetic material is desirably used as the constituent material of the substrate 711 not to hinder the magnetic field from the coil 35.

Note that the substrate 711 can be omitted depending on the shape of the connecting members 712, the setting position of the temperature adjusting element 22, and the like. In this case, the temperature adjusting element 22 only has to be set in a position in contact with the connecting members 712.

As shown in FIG. 10, the package 72 has a function of housing the main section 71 and the supporting member 73. Note that components other than the components explained above may be housed in the package 72.

The package 72 includes a tabular base body 721 (a base) and a bottomed cylindrical lid body 722. An opening of the lid body 722 is sealed by the base body 721. Consequently, an internal space for housing the main section 71 and the supporting member 73 is formed. The lid body 722 is separated from the main section 71 and the supporting member 73. That is, a space is provided between the lid body 722 and the main section 71 and the supporting member 73. Consequently, the space functions as a heat insulating layer. It is possible to reduce heat interference between the main section 71 and the outside of the package 72.

The base body 721 supports the main section 71 via the supporting member 73.

The base body 721 is a wiring substrate. Although not shown in the figure, a plurality of wires and a plurality of terminals for energization of the inside and the outside of the packager 72 are provided on the base body 721. The light source section 21 and the substrate 711 are respectively electrically connected to the base body 721 via not-shown wires (e.g., flexible wiring boards or bonding wires).

A constituent material of the base body 721 is not particularly limited. For example, a resin material, a ceramics material, and the like can be used.

The lid body 722 is joined to the base body 721.

A method of joining the base body 721 and the lid body 722 is not particularly limited. For example, soldering, seam welding, and energy beam welding (laser welding, electron beam welding, etc.) can be used.

Note that a joining member for joining the base body 721 and the lid body 722 may be interposed therebetween.

A constituent material of the lid body 722 is not particularly limited. For example, a resin material, a ceramics material, and a metal material can be used.

The base body 721 and the lid body 722 are desirably air-tightly joined. That is, the inside of the package 72 is desirably an air-tight space. Consequently, it is possible to change the inside of the package 72 to a decompressed state or an inert gas encapsulated state. As a result, it is possible to improve characteristics of the atomic oscillator 1.

In particular, the inside of the package 72 is desirably in the decompressed state. Consequently, it is possible to suppress transmission of heat via the space in the package 72. Therefore, it is possible to suppress heat interference between the connecting members 712 and the outside of the package 72 and between the temperature adjusting element 22 and the atomic cell 31 via the space in the package 72. It is possible to more effectively suppress transmission of heat between the main section 71 and the outside of the package 72.

The supporting member 73 is housed in the package 72 and has a function of supporting the main section 71 in the package 72 (more specifically, the base body 721 configuring a part of the package 72). That is, the supporting member 73 directly or indirectly supports the section of the main section 71 on the base body 721 of the package 72. More specifically, the upper end of the supporting member 73 is joined to the substrate 711 of the main section 71 and the lower end of the supporting member 73 is joined to the base body 721 respectively by adhesives or the like.

The supporting member 73 has a function of suppressing transmission of heat between the main section 71 and the outside of the package 72. Consequently, it is possible to suppress heat interference between the sections of the main section 71 and the outside.

A constituent material of the supporting member 73 is not particularly limited as long as the constituent material has relatively low thermal conductivity and can secure rigidity enough for the supporting member 73 to support the main section 71. For example, nonmetal such as a resin material or a ceramics material is desirably used. The resin material is more desirably used. When the supporting member 73 is mainly made of the resin material, it is possible to increase the heat resistance of the supporting member 73. Even if the shape of the supporting member 73 is complicated, it is possible to easily manufacture the supporting member 73 using a publicly-known method such as injection molding. In particular, when the supporting member 73 is mainly made of the resin material, it is possible to easily form the supporting member 73 made of a foaming body.

As a constituent material of the supporting member 73, a nonmagnetic material is desirably used not to hinder the magnetic field from the coil 35.

Control Section

As shown in FIG. 9, the control section 6A includes the light-source control section 61, the bias detecting section 64, the light-source-temperature control section 65, and the storing section 66.

With the atomic oscillator 1 configured as explained above as well, it is possible to improve the frequency stability (in particular, the long-term frequency stability) through the bias control by the light-source control section 61 and the temperature control by the light-source-temperature control section 65.

In this embodiment, as explained above, the temperature adjusting element 22 and the temperature sensor 23 are used for the temperature control of the atomic cell 31 as well. Therefore, the temperature of the atomic cell 31 changes in a long term. Therefore, in this embodiment, to prevent a frequency characteristic from changing according to the temperature change of the atomic cell 31, it is desirable to encapsulate, in the atomic cell 31, a buffer gas obtained by mixing two or more kinds of gas (e.g., argon and nitrogen) to eliminate the temperature change of the atomic cell 31. Alternatively, the light-source control section 61 desirably correct the frequency characteristic on the basis of a temperature characteristic of the atomic cell 31 measured and set in advance.

2. Electronic Apparatus

An electronic apparatus according to the invention is explained below.

Figure 11:
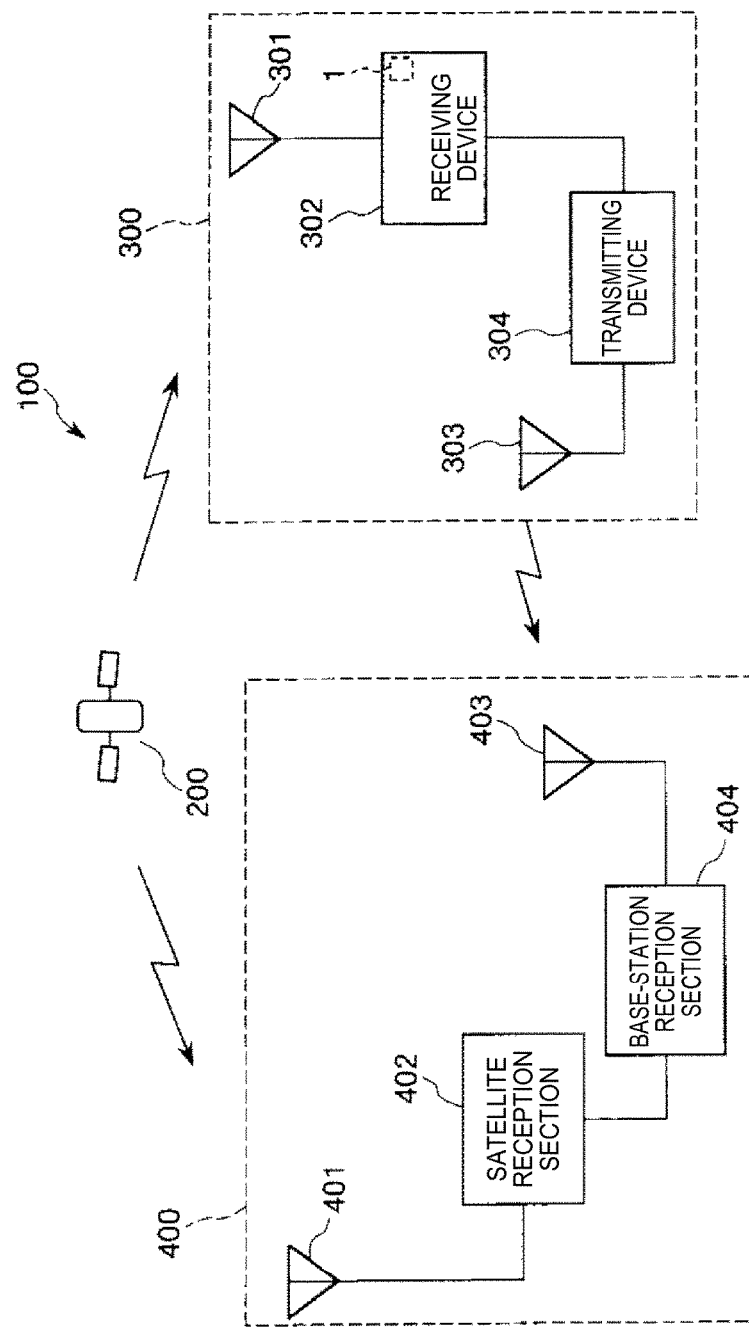
FIG. 11 is a diagram showing a schematic configuration in which an atomic oscillator (a quantum interference device) according to the invention is used in a positioning system utilizing a GPS satellite.

FIG. 11 is a diagram showing a schematic configuration in which an atomic oscillator (a quantum interference device) according to the invention is used in a positioning system utilizing a GPS satellite.

A positioning system 100 shown in FIG. 11 is configured by a GPS satellite 200, a base station apparatus 300, and a GPS reception apparatus 400.

The GPS satellite 200 transmits positioning information (a GPS signal).

The base station apparatus 300 includes a receiving device 302 that highly accurately receives the positioning information from the GPS satellite 200 via an antenna 301 set at, for example, an electronic reference point (a GPS continuous observation station) and a transmitting device 304 that transmits, via an antenna 303, the positioning information received by the receiving device 302.

The receiving device 302 is an electronic device including the atomic oscillator according to the invention as a reference-frequency oscillation source. The receiving device 302 has excellent reliability. The positioning information received by the receiving device 302 is transmitted by the transmitting device 304 on a real-time basis.

The GPS reception apparatus 400 includes a satellite reception section 402 that receives the positioning information from the GPS satellite 200 via an antenna 401 and a base-station reception section 404 that receives the positioning information from the base station apparatus 300 via an antenna 403.

3. Moving Object

Figure 12:
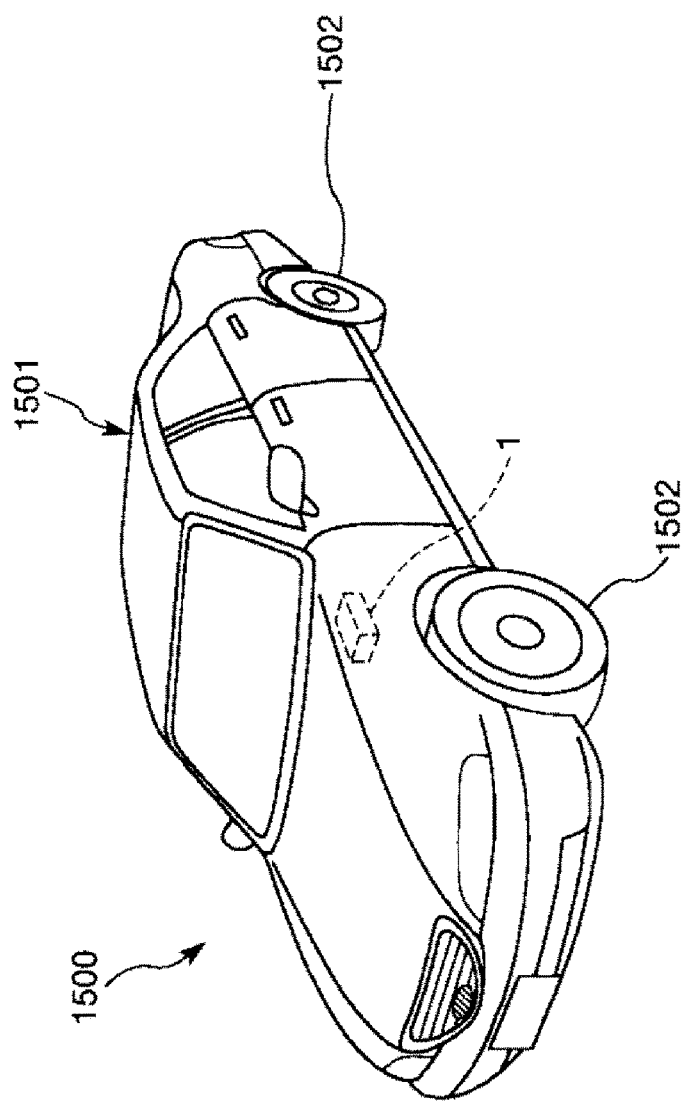
FIG. 12 is a diagram showing an example of a moving object according to the invention.

FIG. 12 is a diagram showing an example of a moving object according to the invention.

In the figure, a moving object 1500 includes a vehicle body 1501 and four wheels 1502. The moving object 1500 is configured to rotate the wheels 1502 with a not-shown power source (an engine) provided in the vehicle body 1501. In the moving object 1500, the atomic oscillator 1 is incorporated.

With the moving object, it is possible to exhibit excellent reliability.

Note that the electronic apparatus including the atomic oscillator (the quantum interference device) according to the invention is not limited to the electronic apparatus explained above. The electronic apparatus can be applied to, for example, a cellular phone, a digital still camera, an inkjet-type discharge apparatus (e.g., an inkjet printer), personal computers (a mobile personal computer and a laptop personal computer), a television, a video camera, a video tape recorder, a car navigation apparatus, a pager, an electronic notebook (including an electronic notebook with a communication function), an electronic dictionary, an electronic calculator, an electronic game machine, a word processor, a work station, a video phone, a security television monitor, an electronic binocular, a POS terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), a flight simulator, a ground digital broadcast, and a cellular phone base station.

The quantum interference device, the atomic oscillator, the electronic apparatus, and the moving object according to the invention are explained above on the basis of the embodiments shown in the figures. However, the invention is not limited to the embodiments.

In the quantum interference device, the atomic oscillator, the electronic apparatus, and the moving object according to the invention, the components of the sections can be replaced with any components that exhibit functions same as the functions in the embodiments. Any components can also be added.

In the quantum interference device, the atomic oscillator, the electronic apparatus, and the moving object according to the invention, any components in the embodiments may be combined with one another.

What is claimed is:

1. A quantum interference device comprising:
   an atomic cell in which metal atoms are encapsulated;
   a light source configured to receive a bias and emit light including a resonance light pair for causing the metal atoms to resonate;
   a storage that is configured to store a reference value of the bias;
   a light source temperature adjustor configured to adjust temperature of the light source;
   a bias detector configured to detect information with respect to the bias; and
   a light-source-temperature-adjustor controller configured to control the light source temperature adjustor based on the information detected by the bias detector,
   wherein the light-source-temperature-adjustor controller is configured to control the light source temperature adjustor based on a comparison result of the information detected by the bias detector and the reference value.

2. The quantum interference device according to claim 1, wherein the light source includes a surface emitting laser.

3. The quantum interference device according to claim 1, wherein the information detected by the bias detector includes a voltage value of the bias.

4. The quantum interference device according to claim 1, wherein the information detected by the bias detector includes a current value of the bias.

5. The quantum interference device according to claim 1, further comprising a bias controller configured to control the bias to adjust a wavelength of the light emitted from the light source to a predetermined value.

6. The quantum interference device according to claim 5, wherein the light-source-temperature-adjustor controller is configured to cause the light source temperature adjustor adjust a temperature of the light source to a predetermined temperature, and
   the light-source-temperature-adjustor controller is configured to adjust the predetermined temperature at a time interval longer than a control time interval of the bias controller based on the information detected by the bias detector.

7. The quantum interference device according to claim 6, wherein the time interval is within a range of 1000 seconds and 1000000 seconds.

8. An atomic oscillator comprising:
   the quantum interference device according to claim 1; and
   a light receiver that is configured to receive light which is output from the atom cell.

9. An atomic oscillator comprising:
   the quantum interference device according to claim 2; and
   a light receiver that is configured to receive light which is output from the atom cell.

10. An atomic oscillator comprising:
    the quantum interference device according to claim 3; and
    a light receiver that is configured to receive light which is output from the atom cell.

11. An electronic apparatus comprising:
    the quantum interference device according to claim 1; and
    a receiver that is configured to receive information via antenna,
    wherein the quantum interference device is located in the receiver.

12. An electronic apparatus comprising:
    the quantum interference device according to claim 2; and
    a receiver that is configured to receive information via antenna,
    wherein the quantum interference device is located in the receiver.

13. An electronic apparatus comprising:
the quantum interference device according to claim 3; and
a receiver that is configured to receive information via antenna,
wherein the quantum interference device is located in the receiver.

14. A moving object comprising:
the quantum interference device according to claim 1; and
a movable body that houses the quantum interference device.

15. A moving object comprising:
the quantum interference device according to claim 2; and
a movable body that houses the quantum interference device.

16. The quantum interference device according to claim 1, further comprising:
a light receiver that is configured to detect intensity of the light transmitted through the atomic cell; and
a bias controller configured to control the bias based on the intensity of the light detected by the light receiver.

17. The quantum interference device according to claim 16,
wherein the bias from the bias controller is input to the light source and the bias detector.

* * * * *